(12) United States Patent
Lafort et al.

(10) Patent No.: US 12,195,329 B2
(45) Date of Patent: Jan. 14, 2025

(54) MICRO-ELECTROMECHANICAL TRANSDUCER WITH REDUCED SIZE

(71) Applicant: Sonion Nederland B.V., Hoofddorp (NL)

(72) Inventors: Adrianus Maria Lafort, Hoofddorp (NL); Rasmus Voss, Hoofddorp (DK)

(73) Assignee: Sonion Nederland B.V., Hoofddorp (NL)

( * ) Notice: Subject to any disclaimer, the term of this patent is extended or adjusted under 35 U.S.C. 154(b) by 454 days.

(21) Appl. No.: 17/535,001

(22) Filed: Nov. 24, 2021

(65) Prior Publication Data

US 2022/0169499 A1 Jun. 2, 2022

(30) Foreign Application Priority Data

Nov. 30, 2020 (DK) .......................... PA 2020 70801

(51) Int. Cl.
*B81B 7/02* (2006.01)
*H04R 19/00* (2006.01)

(52) U.S. Cl.
CPC ............. *B81B 7/02* (2013.01); *H04R 19/005* (2013.01); *B81B 2201/0264* (2013.01); *B81B 2203/0127* (2013.01)

(58) Field of Classification Search
CPC .. B81B 7/02; B81B 2201/0264; H04R 19/005
See application file for complete search history.

(56) References Cited

U.S. PATENT DOCUMENTS

2007/0222008 A1  9/2007 Chen et al.
2010/0027830 A1  2/2010 Hsu et al.
2017/0350701 A1* 12/2017 Geisberger ......... G01C 19/5747
2019/0233278 A1*  8/2019 Robert ................ B81C 1/00047
2021/0302225 A1*  9/2021 Chen ..................... G01H 11/06

FOREIGN PATENT DOCUMENTS

| CN | 101935007 A | 1/2011 |
| EP | 1992588 A2 | 11/2008 |
| EP | 3342749 A2 | 7/2018 |

OTHER PUBLICATIONS

Danish Search Opinion dated May 28, 2021 issued in corresponding Danish Priority Application No. PA 2020 70801.

* cited by examiner

*Primary Examiner* — Kimberly N Rizkallah
*Assistant Examiner* — Nicholas B Michaud
(74) *Attorney, Agent, or Firm* — Harness, Dickey & Pierce, P.L.C.

(57) ABSTRACT

The present invention relates to a micro-electromechanical transducer comprising a pressure detecting arrangement adapted to detect generated pressure variations, and provide an output signal in response to the detected pressure variations, wherein the pressure detecting arrangement comprises a microphone cartridge and a signal processing unit; a pressure generating arrangement adapted to generate pressure variations in response to vibrations thereof; and a volume separating element comprising one or more openings, wherein the microphone cartridge is at least partly arranged in a first opening of the volume separating element in order to reduce the overall height of the micro-electromechanical transducer. The present invention further relates to a hearing device comprising a micro-electromechanical transducer.

13 Claims, 7 Drawing Sheets

MICRO-ELECTROMECHANICAL TRANSDUCER WITH REDUCED SIZE

RELATED APPLICATIONS

This application claims priority to Danish Patent Application No. DK PA 2020 70801 filed on Nov. 30, 2020, the entire contents of which are incorporated herein by reference.

FIELD OF THE INVENTION

The present invention relates to a micro-electromechanical transducer having a reduced size. In particular, the present invention relates to a micro-electromechanical transducer comprising; a pressure detecting arrangement adapted to detect generated pressure variations, and provide an output signal in response to the detected pressure variations, wherein the pressure detecting arrangement comprises a microphone cartridge and a signal processing unit; a pressure generating arrangement adapted to generate pressure variations in response to vibrations thereof; and a volume separating element comprising one or more openings.

BACKGROUND OF THE INVENTION

The integration of micro-electromechanical transducers in the form of vibration sensors into hearing devices, such as hearing aids and earbuds, has increased significantly over the past decade. The benefits of integrating micro-electromechanical transducers (vibration sensors) into hearing devices are many—including noise reduction via bone conduction voice pick-up and control of the hearing device via tapping.

An example of a prior art micro-electromechanical transducer may for example be found in EP 3 342 749 A2 which relates to a micro-electromechanical transducer in the form of a vibration sensor comprising a stand-alone and self-contained MEMS microphone and a sub-assembly attached thereto. MEMS is an abbreviation for a micro-electromechanical system. The sub-assembly is adapted to generate pressure variations when the micro-electromechanical transducer is exposed to vibrations, whereas the MEMS microphone is adapted to detect and convert detected pressure variations to an electrical output signal.

An increased integration of various transducers, including vibration sensors, into modern hearing devices puts further demands on the transducer manufactures in terms of reducing the overall size of the transducers. In this respect the micro-electromechanical transducer suggested in EP 3 342 749 A2 is disadvantageous due to its relative significant height.

It may therefore be seen as an object of embodiments of the present invention to provide a micro-electromechanical transducer in the form of a vibration sensor having a reduced size without losing sensitivity.

DESCRIPTION OF THE INVENTION

The above-mentioned object is complied with by providing, in a first aspect, a micro-electromechanical transducer comprising
1) a pressure detecting arrangement adapted to detect generated pressure variations, and provide an output signal in response to the detected pressure variations, wherein the pressure detecting arrangement comprises a microphone cartridge and a signal processing unit,
2) a pressure generating arrangement adapted to generate pressure variations in response to vibrations thereof, and
3) a volume separating element comprising one or more openings,
wherein the microphone cartridge is at least partly arranged in a first opening of the volume separating element.

Thus, the present invention relates, in a first aspect, to a micro-electromechanical transducer, such as a vibration sensor, comprising a pressure detecting arrangement and a pressure generating arrangement. The role of the pressure generating arrangement is to generate a pressure change when the micro-electromechanical transducer is exposed to vibrations, whereas the role of the pressure detecting arrangement is to detect and convert the generated pressure change to an electrical output signal.

Preferably, the pressure detecting arrangement and the pressure generating arrangement are manufactured as distinct assemblies which are subsequently combined to form the micro-electromechanical transducer. The pressure detecting arrangement is preferably implemented as a MEMS microphone comprising the microphone cartridge and the signal processing unit. The pressure generating arrangement is preferably implemented as a sub-assembly secured to the MEMS microphone.

In the present context the volume separating element should be understood as an acoustical barrier, such as a printed circuit board (PCB) or a wall element, that separates volumes within the micro-electromechanical transducer. As it will be discussed in further details below the volume separating element may be considered as forming part of a boundary, such as part of a housing, of the pressure detecting arrangement.

The micro-electromechanical transducer of the first aspect is advantageous in that the microphone cartridge is at least partly arranged in a first opening of the volume separating element as this reduces the overall height of the micro-electromechanical transducer compared to prior art solutions. In fact the overall height of the micro-electromechanical transducer of the first aspect may be less than 1 mm. The one or more openings in the volume separating element are preferably through-going openings.

As it will be discussed in further details below, the microphone cartridge may be arranged in the first through-going opening of the volume separating element in at least the following three ways: the microphone cartridge may be aligned with an upper surface of the volume separating element, the microphone cartridge may be aligned with a lower surface of the volume separating element, or the microphone cartridge is not aligned with any of the upper and lower surfaces of the volume separating element.

In a first embodiment the volume separating element preferably comprises a first PCB electrically connected to at least the signal processing unit, said first PCB comprising the one or more through-going openings. Preferably, the microphone cartridge is at least partly arranged in a first through-going opening in the first PCB, and secured to the first PCB using a sealing. Moreover, the signal processing unit is preferably arranged at least partly in a second through-going opening of the first PCB, and secured to the first PCB using a sealing.

As already addressed it is advantageous to arrange in particular the microphone cartridge in a through-going opening of the first PCB as this facilitates that the overall height of the micro-electromechanical transducer can be reduced.

The microphone cartridge, the signal processing unit and the first PCB may be interconnected using wire bonding.

Alternatively, the microphone cartridge, the signal processing unit and the first PCB may be interconnected using printed interconnections. More particularly, the microphone cartridge may be connected to the signal processing unit using wire bonding, and the signal processing unit may be connected to the first PCB also using wire bonding. However, and in order to save space, the microphone cartridge is preferably connected to the signal processing unit using under-filled printed interconnections, and the signal processing unit is preferably connected to the first PCB also using under-filled printed interconnections. The under-filling material preferably comprises a dielectric material.

The pressure generating arrangement preferably comprises a suspension member and moveable mass secured thereto. It is advantageous that the moveable mass does not form part of the pressure detection arrangement, and that a coupling volume arranged between the pressure generating arrangement and the pressure detection arrangement is as small as possible.

In order to further reduce the height of the micro-electromechanical transducer the moveable mass preferably comprises an indentation adapted to accommodate at least part of the microphone cartridge. The indentation in the moveable mass defines a volume. The majority of this volume is used for accommodating at least part of the microphone cartridge. The dimensions of the indentation relative to the dimensions of the microphone cartridge are chosen so that the moveable mass is capable of moving freely relative to the microphone cartridge.

The micro-electromechanical transducer preferably further comprises a second PCB comprising a plurality of contact zones arranged on an exterior surface thereof, said second PCB being oppositely arranged relative to the first PCB. The term "oppositely" should be interpreted relative to a rear volume of the micro-electromechanical transducer in that the first and second PCBs are preferable arranged on opposite sides of this rear volume. Moreover, the first and second PCBs are preferable arranged in parallel. The second PCB with its contact zones arranged thereon is advantageous in that it facilitates easy electrical contact to external components, such as power supplies, additional signal processing circuits etc.

In a second embodiment the micro-electromechanical transducer preferably comprises a second PCB comprising a plurality of contact zones arranged on an exterior surface thereof, said second PCB being oppositely arranged relative to the first PCB, wherein the second PCB comprises an indentation in an interior surface. Again, the term "oppositely" should be interpreted relative to a rear volume in that the first and second PCBs are preferable arranged on opposite sides of this rear volume. Moreover, the first and second PCBs are preferable arranged in parallel. The indentation provided in the second PCB is preferably adapted to accommodate at least part of the microphone cartridge, provide space for wire bonding and/or provide space for printed connections. Optionally, the moveable mass may also comprise an indentation adapted to accommodate at least part of the microphone cartridge. Again, the indentation(s) define(s) a volume, wherein the majority of this volume is used for accommodating at least part of the microphone cartridge.

In a third embodiment the volume separating element comprises a plate, such as a non-conducting plate, comprising the one or more through-going openings. Preferably, the microphone cartridge is secured to the first through-going opening of the volume separating element using a sealing. With respect to electrical connections the microphone cartridge and the signal processing unit are preferably flip-chip mounted to an interior surface of a bottom PCB, said bottom PCB comprising a plurality of contact zones arranged on an exterior surface thereof. Again, the contact zones of the bottom PCB are advantageous in that they facilitate easy electrical contact to external components, such as power supplies, additional signal processing circuits etc. The flip-chip mounting approach relied upon in this third embodiment is also advantageous in that it represents a thoroughly tested mounting technique.

Venting channels are preferably provided beneath the microphone cartridge and the signal processing unit, i.e. between the microphone cartridge and the interior surface of a bottom PCB, and between the signal processing unit and the interior surface of a bottom PCB. The existence of these venting channels beneath the microphone cartridge and the signal processing unit are advantageous in that air is then allowed to flow or circulate more freely in a rear volume of the micro-electromechanical transducer. Also in this third embodiment the pressure generating arrangement preferably comprises a suspension member and moveable mass secured thereto, i.e. the moveable mass is again separated from the pressure detection arrangement.

In order to reduce the height of the micro-electromechanical transducer the moveable mass preferably comprises an indentation adapted to accommodate at least part of the microphone cartridge. As previously mentioned, the indentation in the moveable mass defines a volume which is used for accommodating at least part of the microphone cartridge. The dimensions of the indentation are chosen so that the moveable mass is capable of moving freely relative to the microphone cartridge.

In the above-mentioned first, second and third embodiments a coupling volume preferably exists between the pressure generating arrangement and microphone cartridge. The role of the coupling volume is to transmit generated pressure changes from the pressure generating arrangement to the pressure detecting arrangement.

In a second aspect, the present invention relates to a hearing device comprising a micro-electromechanical transducer according to the first aspect, said hearing device being selected from the group consisting of: hearing aids, earbuds, personal audio devices, earphones, hearables etc. Preferably, the micro-electromechanical transducer is a vibration sensor adapted to detect for example bone conduction related vibrations and/or tapping applied to the hearing device.

In general, the various aspects of the invention may be combined and coupled in any way possible within the scope of the invention. These and other aspects, features and/or advantages of the invention will be apparent from and elucidated with reference to the embodiments described hereinafter.

BRIEF DESCRIPTION OF THE DRAWINGS

The present invention will now be described in further details with reference to the accompanying figures where.

DETAILED DESCRIPTION OF THE INVENTION

In general, the present invention relates to a micro-electromechanical transducer, such as a vibration sensor, comprising a pressure detecting arrangement and a pressure generating arrangement. The role of the pressure generating arrangement is to generate pressure variations when the micro-electromechanical transducer is exposed to vibrations, whereas the role of the pressure detecting arrangement is to detect and convert the generated pressure variations to an electrical output signal. In order to reduce in particular the height of the micro-electromechanical transducer indentations for enclosing or accommodating at least part of a microphone cartridge is provided—either in a moveable mass and/or in a PCB. The overall height of the micro-electromechanical transducer of the present invention is preferably smaller than 1 mm. The present invention also relates to a hearing device comprising a micro-electromechanical transducer, such as a vibration sensor, for detecting for example bone conduction related vibrations and/or tapping applied to the hearing device.

Figure 1:
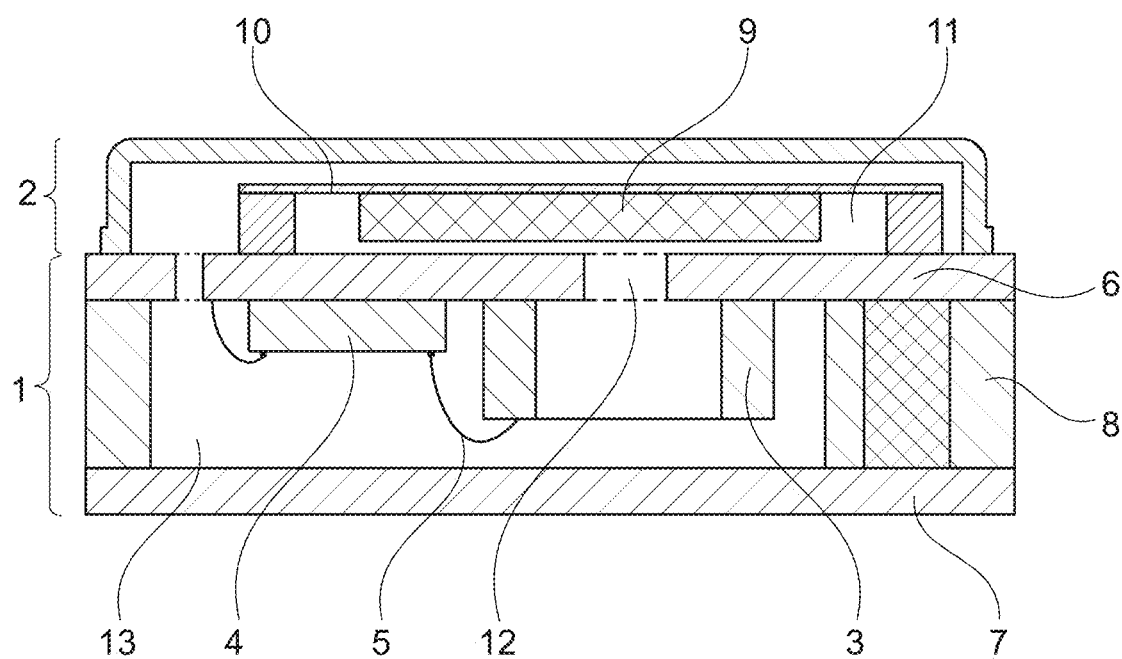
FIG. 1 shows a cross-sectional view of a micro-electromechanical transducer according to the prior art.

FIG. 1 shows a prior art micro-electromechanical transducer in the form of a vibration sensor comprising a stand-alone and self-contained MEMS microphone 1 and a sub-assembly 2 attached thereto. The sub-assembly 2 is adapted to generate pressure variations when the micro-electromechanical transducer is exposed to vibrations, whereas the MEMS microphone 1 is adapted to detect and convert detected pressure variations to an electrical output signal. The sub-assembly 2 comprises a moveable mass 9 suspended in a suspension member 10 in a manner so that the moveable mass 9 moves/vibrates up and down when the micro-electromechanical transducer is exposed to vibrations. The MEMS microphone 1 comprises a microphone cartridge 3 which is sensitive to the generated pressure variations, and a signal processing circuit 4 for processing signals from the microphone cartridge 3. The microphone cartridge 3 and the signal processing circuit 4 are interconnected and arranged in a rear volume 13 being defined by a first PCB 6, a second PCB 7 and a wall portion 8. Wire bonding 5 is provided for electrical connections between the various elements. The generated pressure variations are coupled to the microphone cartridge 3 via a coupling volume 11 and a through-going opening 12 in the first PCB 6. The prior art micro-electromechanical transducer shown in FIG. 1 is based on a stand-alone and self-contained MEMS microphone 1, and its combination with the sub-assembly 2 is thus not optimised with respect to size—in particular not with respect to the overall height of the micro-electromechanical transducer.

Figure 2:
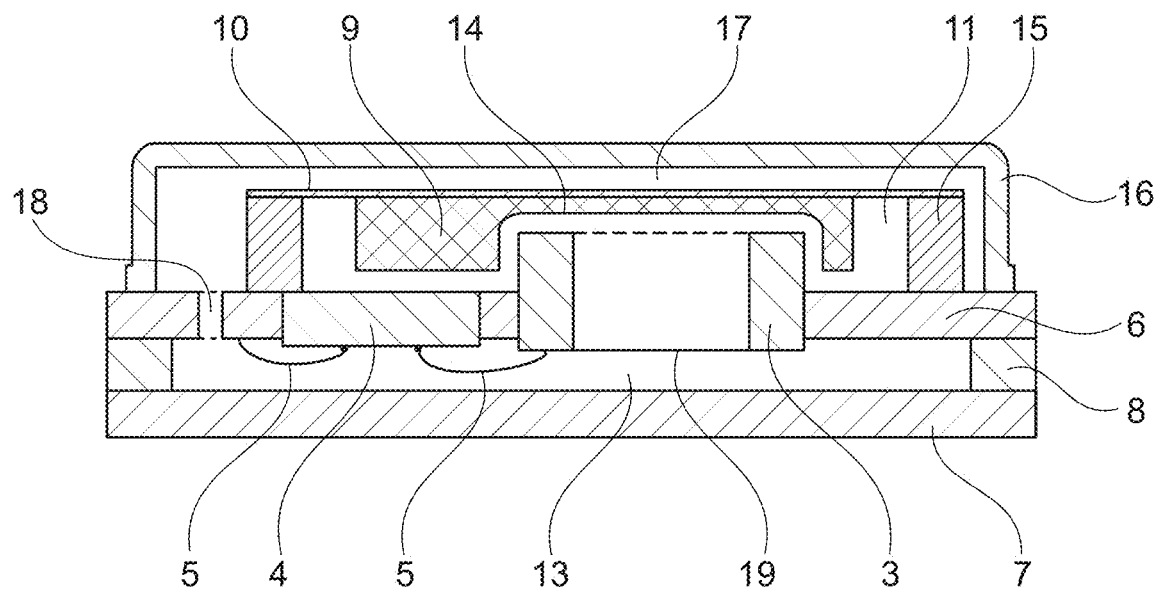
FIG. 2 shows a cross-sectional view of a first embodiment of the present invention where an embedded microphone cartridge and an embedded signal processing unit are interconnected via wire bonding, and where an indentation is provided in the moveable mass.

Turning now to FIG. 2, a cross-sectional view of an embodiment of the present invention is shown. The embodiment shown in FIG. 2 is advantageous over the prior art micro-electromechanical transducer shown in FIG. 1 due to its more compact design—more particularly its reduced height. The micro-electromechanical transducer comprises a sandwich construction comprising a first PCB 6 and a second PCB 7 being separated by a wall portion 8. The first PCB 6, the second PCB 7 and the wall portion 8 enclose a rear volume 13. The first PCB 6 comprises three through-going openings—namely venting opening 18 (optional), an opening for accommodating a signal processing circuit 4, and an opening for accommodating a microphone cartridge 3 having a pressure sensitive membrane 19. As seen, the microphone cartridge 3 is connected to the signal processing unit 4 using wire bonding 5, and the signal processing unit 4 is connected to the first PCB 6 also using wire bonding 5. In order to establish electrical connections to external components, such as power supplies, further signal processing circuits etc., electrical contact zones (not shown) are preferably provided on the lower surface of the second PCB 7.

In terms of mounting, the microphone cartridge 3 is secured to the first PCB 6 in a manner so that it extends both into the coupling volume 11 and into the rear volume 13. The signal processing circuit 4 is secured to the first PCB 6 with its upper surface aligned with the upper, surface of the first PCB 6. An appropriate sealing material (not shown in FIG. 2) is used for securing both the signal processing circuit 4 and the microphone cartridge 3 to the first PCB 6.

The pressure variations to be detected are generated by the moveable mass 9 which is suspended in the suspension member 10. The moveable mass 9 is adapted to move/vibrate up and down when the micro-electromechanical transducer is exposed to vibrations, and the generated pressure variations are coupled to the microphone cartridge 3 via the coupling volume 11. A spacer 15 is arranged between the first PCB 6 and the suspension member 10, and a housing 16 is provided for encapsulation and for defining a rear volume 17 which is connected to the rear volume 13 via the optional venting opening 18.

In order to reduce the overall height of the micro-electromechanical transducer an indentation 14 is provided in the moveable mass 9. As shown in FIG. 2 this indentation 14 is adapted to accommodate at least a part of the microphone cartridge 3 whereby the overall height of the micro-electromechanical transducer is significantly reduced. In terms of numbers the depth of the indentation 14 may preferably be chosen so that at least 25%, such as at least 30%, such as at least 35%, such as at least 40%, such as at least 45%, such as at least 50% of the height of the microphone cartridge 3 (above the first PCB 6) is accommodated in the indentation 14. To increase the depth of the indentation 14 even further the indentation 14 may, in an alternative embodiment, be implemented as a through-going opening or hole in the moveable mass 9. The depth of the indentation 14 then equals the thickness of the moveable mass 9.

Figure 3:
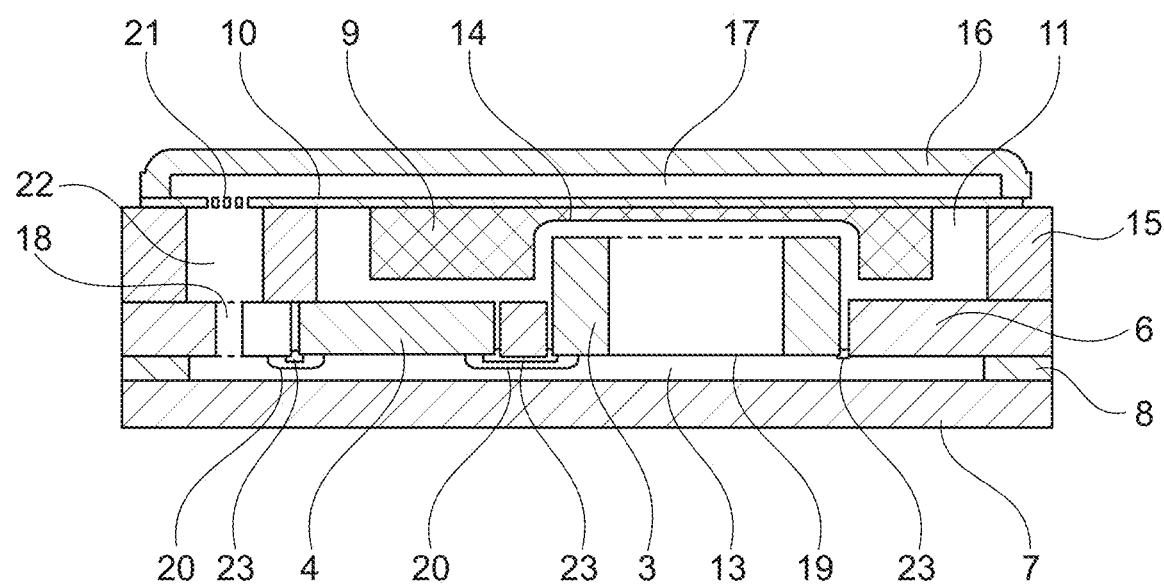
FIG. 3 shows a cross-sectional view of a second embodiment of the present invention where an embedded microphone cartridge and an embedded signal processing unit are interconnected via printed interconnections, and where an indentation is provided in the moveable mass.

Referring now to FIG. 3, a cross-sectional view of another embodiment of the present invention is shown. The embodiment shown in FIG. 3 is also advantageous over prior art micro-electromechanical transducers due to its reduced height. The micro-electromechanical transducer shown in FIG. 3 comprises a sandwich construction comprising a first PCB 6 and a second PCB 7 being separated by a small wall portion 8. The first PCB 6, the second PCB 7 and the wall portion 8 enclose a rear volume 13 having a reduced height compared to the corresponding rear volume 13 of the embodiment shown in FIG. 2. Similar to the embodiment shown in FIG. 2, the first PCB 6 again comprises three through-going openings—namely venting opening 18 (optional), an opening for accommodating a signal processing circuit 4, and an opening for accommodating a microphone cartridge 3 having a pressure sensitive membrane 19. As seen in FIG. 3 the microphone cartridge 3 is connected to the signal processing unit 4 using printed connections 20, and the signal processing unit 4 is connected to the first PCB 6 also using printed connections 20. The printed connections 20 are provided on top of a dielectric material 23 which also secures both the signal processing circuit 4 and the microphone cartridge 3 to the first PCB 6. In order to establish electrical connections to external components, such as power supplies, further signal processing circuits etc., electrical contact zones (not shown) are preferably provided on the lower surface of the second PCB 7.

As shown in FIG. 3 both the signal processing circuit 4 and the microphone cartridge 3 are secured to the first PCB 6 with their respective lower surfaces aligned with the lower surface of the first PCB 6. As already mentioned an appropriate dielectric material 23 secures both the signal processing circuit 4 and the microphone cartridge 3 to the first PCB 6. The dielectric material 23 also provides appropriate sealing properties as well as a mechanical support for the printed connections 20.

The moveable mass 9, which is suspended in the suspension member 10, is adapted to generate pressure variations. The moveable mass 9 is thus adapted to move/vibrate up and down when the micro-electromechanical transducer is exposed to vibrations, and the generated pressure variations are coupled to the microphone cartridge 3 via the coupling volume 11. A spacer 15 is arranged between the first PCB 6 and the suspension member 10, and a housing 16 is arranged on top of the suspension member 10. The housing 16 and the suspension member 10 form a rear volume 17 which is connected to the other rear volume 13 via venting openings 18, 21 and volume 22. Compared to FIG. 2 the surface area of the suspension member 10 is now larger which leads to a higher sensitivity.

In order to reduce the overall height of the micro-electromechanical transducer an indentation 14 is again provided in the moveable mass 9. As previously addressed, and as shown in FIG. 3, this indentation 14 is adapted to accommodate at least a part of the microphone cartridge 3 whereby the overall height of the micro-electromechanical transducer is significantly reduced. In terms of numbers the depth of the indentation 14 may preferably be chosen so that at least 25%, such as at least 30%, such as at least 35%, such as at least 40%, such as at least 45%, such as at least 50% of the height of the microphone cartridge 3 (above the first PCB 6) is accommodated in the indentation 14. To increase the depth of the indentation 14 even further the indentation 14 may, in an alternative embodiment, be implemented as a through-going opening or hole in the moveable mass 9. The depth of the indentation 14 then equals the thickness of the moveable mass 9.

Figure 4:
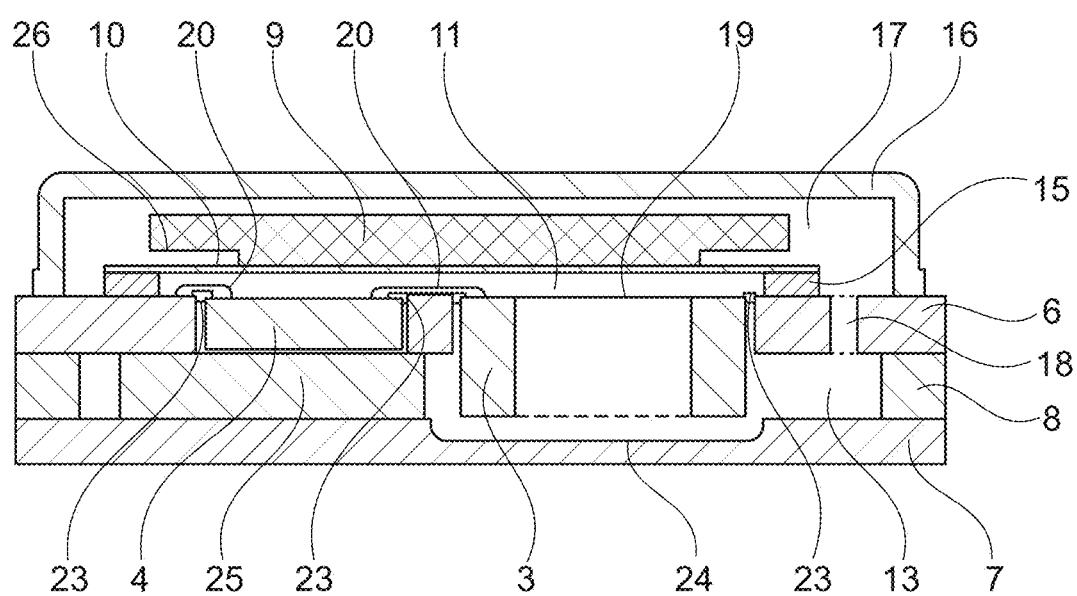
FIG. 4 shows a cross-sectional view of a third embodiment of the present invention where an embedded microphone cartridge and an embedded signal processing unit are interconnected via printed interconnections, and where an indentation is provided in a PCB.

Turning now to FIG. 4, a cross-sectional view of yet another embodiment of the present invention is shown. The embodiment shown in FIG. 4 is also advantageous due to its reduced height compare to prior art transducers. The micro-electromechanical transducer shown in FIG. 4 again comprises a sandwich construction comprising a first PCB 6 and a second PCB 7 being separated by a wall portion 8. The first PCB 6, the second PCB 7 and the wall portion 8 enclose a rear volume 13. Similar to the previous embodiments the first PCB 6 comprises three through-going openings—namely a venting opening 18 (optional), an opening for accommodating a signal processing circuit 4, and an opening for accommodating a microphone cartridge 3 having a pressure sensitive membrane 19. Similar to the embodiment shown in FIG. 3, the microphone cartridge 3 is, in FIG. 4, connected to the signal processing unit 4 using printed connections 20, and the signal processing unit 4 is connected to the first PCB 6 also using printed connections 20. In contrast to the embodiment shown in FIG. 3, where the printed connections 20 are provided on the lower surface of the first PCB 6, the printed connections 20 are, in FIG. 4, provided on the upper surface of the first PCB 6. The printed connections 20 are provided on top of a dielectric material 23 which also secures both the signal processing circuit 4 and the microphone cartridge 3 to the first PCB 6. It should also be noted that the microphone cartridge 3 is arranged so that its pressure sensitive membrane 19 is oriented towards the coupling volume 11. In order to establish electrical connections to external components, such as power supplies, further signal processing circuits etc., electrical contact zones (not shown) are preferably provided on the lower surface of the second PCB 7.

In contrast to the embodiment shown in FIG. 3, both the signal processing circuit 4 and the microphone cartridge 3 are, in FIG. 4, secured to the first PCB 6 with their respective upper surfaces aligned with the upper surface of the first PCB 6. An appropriate dielectric material 23 is applied to secure both the signal processing circuit 4 and the microphone cartridge 3 to the first PCB 6. The dielectric material 23 also provides sealing properties as well as a mechanical support for the printed connections 20. A filling element 25 is provided for reducing the volume of the rear volume 13.

The moveable mass 9, which is secured to an upper surface of the suspension member 10, is adapted to generate pressure variations. The moveable mass 9 is thus adapted to move/vibrate up and down when the micro-electromechanical transducer is exposed to vibrations. A spacer 15 is arranged between the first PCB 6 and the suspension member 10, and a housing 16 is provided for encapsulation and for defining a rear volume 17 which is connected to rear volume 13 via the optional venting opening 18. The moveable mass 9 comprises a peripheral notch 26 in order to facilitate free movements/vibrations of the moveable mass 9. This is advantageous in that it allows a larger moveable mass having the same height or a thinner moveable mass having the same weight.

In order to reduce the overall height of the micro-electromechanical transducer an indentation 24 is provided in the second PCB 7. The role of the indentation 24 in the second PCB 7 is to provide additional space below the microphone cartridge 3 which, in the absence of the indentation 24, would come too close to the upper surface of the second PCB 7. To potentially increase the depth of the indentation 24 even further the indentation 24 may, in an alternative embodiment, be implemented as a through-going opening or hole in the second PCB 7. The depth of the indentation 24 then equals the thickness of the second PCB 7.

Figure 5:
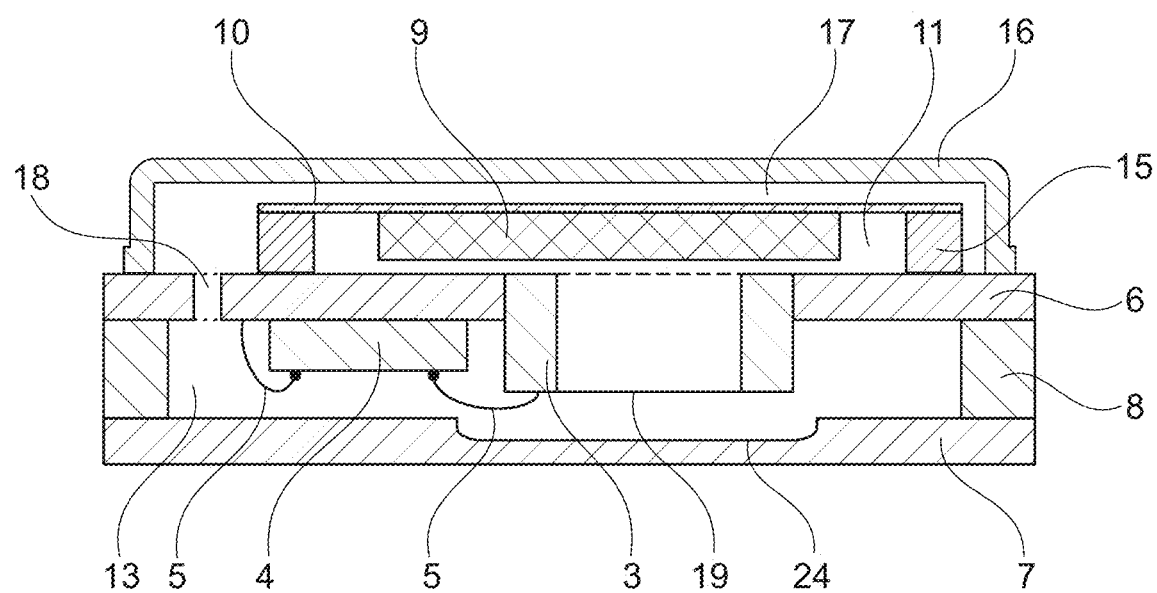
FIG. 5 shows a cross-sectional view of a fourth embodiment of the present invention where an embedded microphone cartridge and an embedded signal processing unit are interconnected via wire bonding, and where an indentation is provided in a PCB.

FIG. 5 shows a cross-sectional view of yet another embodiment of the present invention—also this embodiment is advantageous due to its reduced height compare to prior art transducers. The micro-electromechanical transducer shown in FIG. 5 again comprises a sandwich construction comprising a first PCB 6 and a second PCB 7 being separated by a wall portion 8. The first PCB 6, the second PCB 7 and the wall portion 8 enclose a rear volume 13. As seen in FIG. 5 the first PCB 6 comprises two through-going openings—namely a venting opening 18 (optional) and an opening for accommodating a microphone cartridge 3 having a pressure sensitive membrane 19. A signal processing unit 4 is secured to the lower surface of the first PCB 6. As seen in FIG. 5, the microphone cartridge 3 is connected to the signal processing unit 4 using wire bonding 5, and the signal processing unit 4 is connected to the first PCB 6 also using wire bonding 5. A dielectric material 23 secures the microphone cartridge 3 to the first PCB 6 so that the respective upper surfaces of the microphone cartridge 3 and the first PCB 6 are aligned. In order to establish electrical connections to external components, such as power supplies, further signal processing circuits etc., electrical contact zones (not shown) are preferably provided on the lower surface of the second PCB 7.

The moveable mass 9, which is secured to a lower surface of the suspension member 10, is adapted to generate pressure variations. The moveable mass 9 is thus adapted to move/vibrate up and down when the micro-electromechanical transducer is exposed to vibrations, and the generated pressure variations are coupled to the microphone cartridge 3 via the coupling volume 11. A spacer 15 is arranged between the first PCB 6 and the suspension member 10, and a housing 16 is provided for encapsulation and for defining a rear volume 17 which is connected to rear volume 13 via the optional venting opening 18.

In order to reduce the overall height of the micro-electromechanical transducer an indentation 24 is provided in the second PCB 7. The indentation 24 provides more space for the wire bonding 5 between the microphone cartridge 3 and the signal processing unit 4 as the lower surface of the microphone cartridge 3, in the absence of the indentation 24, would come too close to the upper surface of the second PCB 7. To potentially increase the depth of the indentation 24 even further the indentation 24 may, in an alternative embodiment, be implemented as a through-going opening or hole in the second PCB 7. The depth of the indentation 24 then equals the thickness of the second PCB 7.

Figure 6:
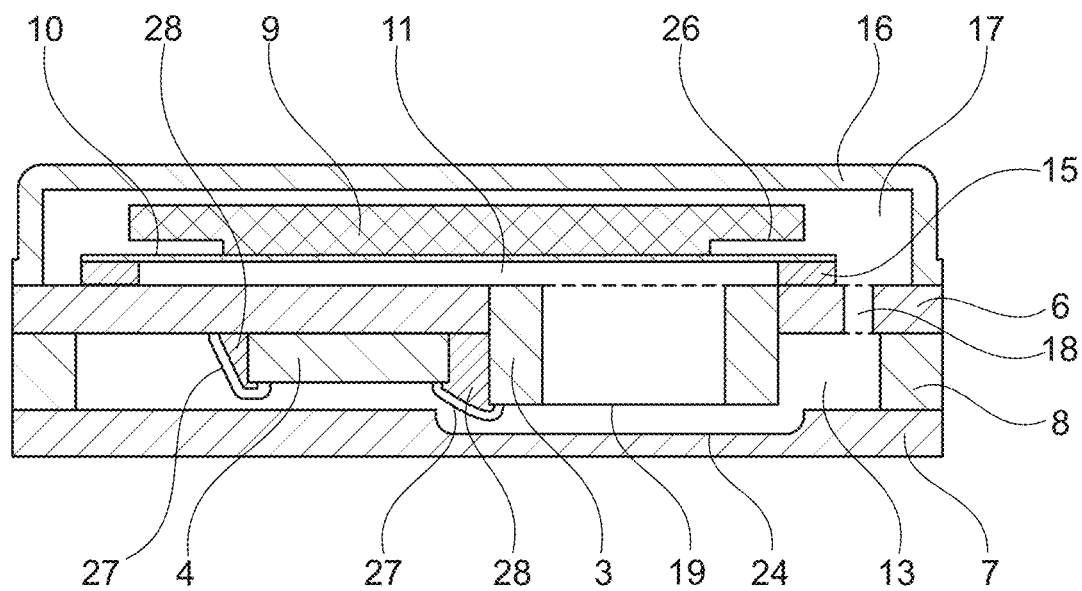
FIG. 6 shows a cross-sectional view of a fifth embodiment of the present invention where an embedded microphone cartridge and an embedded signal processing unit are interconnected via under-filled printed interconnections, and where an indentation is provided in a PCB.
Figure 7:
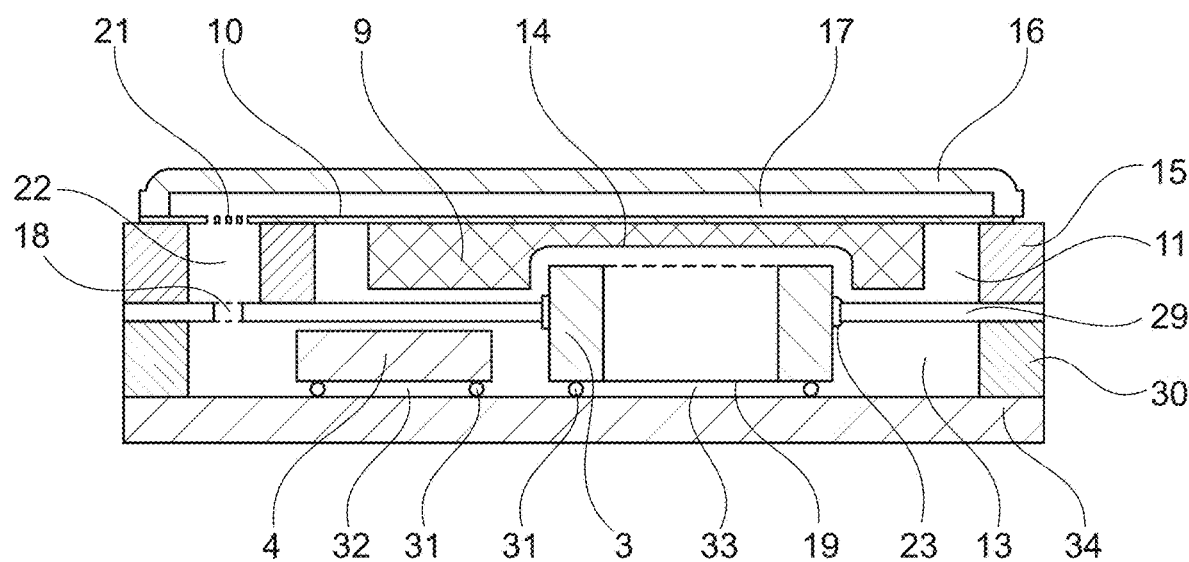
FIG. 7 shows a cross-sectional view of a sixth embodiment of the present invention where a microphone cartridge and a signal processing unit are flip-chip mounted on a bottom PCB, and where an indentation is provided in the moveable mass.

The embodiment shown in FIG. 6 is, to a large extend, similar to the embodiment shown in FIG. 4 with the exceptions that the microphone cartridge 3 is flipped upside-down and that the printed connections 27 are arranged on dielectric filler materials 28 provided on the lower side of the first PCB 6. In order to reduce the overall height of the micro-electromechanical transducer an indentation 24 is provided in the second PCB 7. As seen in FIG. 7 the existence of the indentation 24 provides more space for the printed connections 27 between the microphone cartridge 3 and the signal processing unit 4 in that the lower surface of the microphone cartridge 3, in the absence of the indentation 24, would come too close to the upper surface of the second PCB 7. To potentially increase the depth of the indentation 24 even further the indentation 24 may, in an alternative embodiment, be implemented as a through-going opening or hole in the second PCB 7. The depth of the indentation 24 then equals the thickness of the second PCB 7.

The micro-electromechanical transducer shown in FIG. 6 comprises a sandwich construction comprising a first PCB 6 and a second PCB 7 being separated by a wall portion 8. The first PCB 6, the second PCB 7 and the wall portion 8 enclose a rear volume 13. The first PCB 6 comprises two through-going openings—namely a venting opening 18 (optional) and an opening for accommodating a microphone cartridge 3 having a pressure sensitive membrane 19 oriented towards the second PCB 7. The microphone cartridge 3 is, in FIG. 6, connected to the signal processing unit 4 using printed connections 27, and the signal processing unit 4 is connected to the first PCB 6 also using printed connections 27. The printed connections 27 are, as disclosed above, arranged on top of a dielectric filler material 28 which also secures both the signal processing circuit 4 and the microphone cartridge 3 to the first PCB 6. The microphone cartridge 3 is secured to the first PCB 6 so that the respective upper surfaces of the microphone cartridge 3 and the first PCB 6 are aligned. In order to establish electrical connections to external components, such as power supplies, further signal processing circuits etc., electrical contact zones (not shown) are preferably provided on the lower surface of the second PCB 7.

The pressure variations are generated by the moveable mass 9 which is secured to an upper surface of the suspension member 10. The moveable mass 9 is thus adapted to move/vibrate up and down when the micro-electromechanical transducer is exposed to vibrations. A spacer 15 is arranged between the first PCB 6 and the suspension member 10, and a housing 16 is provided for encapsulation and for defining a rear volume 17 which is connected to rear volume 13 via the optional venting opening 18. The moveable mass 9 comprises a peripheral notch 26 in order to facilitate free movements/vibrations of the moveable mass 9.

Turning now to FIG. 7 a cross-sectional view of yet another advantageous embodiment of the present invention is shown. As the previous embodiments this embodiment also has a reduced height. The micro-electromechanical transducer shown in FIG. 7 comprises a sandwich construction comprising a plate element 29 and a bottom PCB 34 being separated by a spacer 30. The plate element 29, the bottom PCB 34 and the spacer 30 enclose a rear volume 13. The plate element 29 is preferably made of a Kapton™ polyimide film.

As seen in FIG. 7 the plate element 29 comprises two through-going openings—namely a venting opening 18 (optional) and an opening for accommodating a microphone cartridge 3 having a pressure sensitive membrane 19 oriented towards the bottom PCB 34. As seen in FIG. 7 the microphone cartridge 3 and the signal processing unit 4 are both flip-chip mounted to the bottom PCB 34 via solder pads 31 with venting channels 32, 33 being provided between the microphone cartridge 3 and the bottom PCB 34, and between the signal processing unit 4 and the bottom PCB 34. The microphone cartridge 3 is secured to the plate element 29 using a dielectric material 23 also having sealing properties. In order to establish electrical connections to external components, such as power supplies, further signal processing circuits etc., electrical contact zones (not shown) are preferably provided on the lower surface of the bottom PCB 34.

The moveable mass 9, which is suspended in the suspension member 10, is adapted to generate pressure variations when the micro-electromechanical transducer is exposed to vibrations. The generated pressure variations are coupled to the microphone cartridge 3 via the coupling volume 11. A spacer 15 is arranged between the plate element 29 and the suspension member 10, and a housing 16 is arranged on top of the suspension member 10. The housing 16 and the suspension member 10 form a rear volume 17 which is connected to the other rear volume 13 via the optional venting openings 18, 21 and volume 22. Compared to FIG.

2 the surface area of the suspension member 10 is now larger which leads to a higher sensitivity.

In order to reduce the overall height of the micro-electromechanical transducer shown in FIG. 7 an indentation 14 is again provided in the moveable mass 9. As previously addressed, and as shown in FIG. 7, this indentation 14 is adapted to accommodate at least a part of the microphone cartridge 3 whereby the overall height of the micro-electromechanical transducer is significantly reduced. In terms of numbers the depth of the indentation 14 may preferably be chosen so that at least 25%, such as at least 30%, such as at least 35%, such as at least 40%, such as at least 45%, such as at least 50% of the height of the microphone cartridge 3 (above the plate element 29) is accommodated in the indentation 14. To increase the depth of the indentation 14 even further the indentation 14 may, in an alternative embodiment, be implemented as a through-going opening or hole in the moveable mass 9. The depth of the indentation 14 then equals the thickness of the moveable mass 9.

In the embodiments shown in FIGS. 2-7 the overall height micro-electromechanical transducer is preferably less than 2 mm, such as less than 1.5 mm, such as less than 1 mm.

Moreover, the mass of the moveable mass 9 is preferable around 4 mg. It is estimated that the practical minimum mass would be around 0.004 mg as this would increase the noise level with 30 dB. Similarly, a mass of 0.04 mg would increase the noise level with 20 dB, and a mass of 0.4 mg would increase the noise level with 10 dB. Thus, the higher the mass of the moveable mass 9 the lower is the effect of the thermal movement noise of the micro-electromechanical transducer.

Still referring to FIGS. 2-7 the coupling volume 11 should preferably be as small as possible. Preferably, the coupling volume 11 is smaller than 1 mm$^3$, such as smaller than 0.75 mm$^3$, such as smaller than 0.5 mm$^3$, such as smaller than 0.25 mm$^3$, such as smaller than 0.1 mm$^3$, such as smaller than 0.05 mm$^3$.

Also, and still referring to FIGS. 2-7, the total area of the suspension member 10 should be as large as possible, and preferably larger than 0.5 mm$^2$, such as larger than 1 mm$^2$, such as larger than 2 mm$^2$, such as larger than 4 mm$^2$, such as larger than 6 mm$^2$, such as larger than 8 mm$^2$, such as larger than 10 mm$^2$. A large total area is advantageous as this requires a smaller amplitude of the movement of the moveable mass 9 in order to reach certain volume displacement and thereby sensitivity.

Although the invention has been discussed in the foregoing with reference to exemplary embodiments of the invention, the invention is not restricted to these particular embodiments which can be varied in many ways without departing from the invention. The discussed exemplary embodiments shall therefore not be used to construe the appended claims strictly in accordance therewith. On the contrary, the embodiments are merely intended to explain the wording of the appended claims, without intent to limit the claims to these exemplary embodiments. The scope of protection of the invention shall therefore be construed in accordance with the appended claims only, wherein a possible ambiguity in the wording of the claims shall be resolved using these exemplary embodiments.

The invention claimed is:

1. A micro-electromechanical transducer, comprising:
   1) A pressure detecting arrangement adapted to detect generated pressure variations, and provide an output signal in response to the detected pressure variations, wherein the pressure detecting arrangement includes a microphone cartridge and a signal processing unit,
   2) A pressure generating arrangement including a suspension member and moveable mass secured thereto, adapted to generate pressure variations in response to vibrations thereof,
   3) A coupling volume between the pressure generating arrangement and the microphone cartridge, wherein the coupling volume is adapted to transmit the generated pressure variations from the pressure generating arrangement to the pressure detecting arrangement, and
   4) A volume separating element including one or more openings,
   wherein the microphone cartridge is at least partly arranged in a first opening of the volume separating element, and wherein the moveable mass includes an indentation adapted to accommodate at least part of the microphone cartridge,
   wherein the microphone cartridge is at least partially accommodated in the indentation such that the moveable mass surrounds at least part of the microphone cartridge.

2. A micro-electromechanical transducer according to claim 1, wherein the volume separating element comprises a first PCB electrically connected to at least the signal processing unit.

3. A micro-electromechanical transducer according to claim 2, wherein said first PCB comprises the one or more openings.

4. A micro-electromechanical transducer according to claim 3, wherein the microphone cartridge is at least partly arranged in a first opening in the first PCB, and that the microphone cartridge is secured to the first PCB using a sealing.

5. A micro-electromechanical transducer according to claim 3, wherein the signal processing unit is at least partly arranged in a second opening of the first PCB.

6. A micro-electromechanical transducer according to claim 2, wherein the micro-electromechanical transducer further comprises a second PCB comprising a plurality of contact zones arranged on an exterior surface thereof.

7. A micro-electromechanical transducer according to claim 6, wherein said second PCB is oppositely arranged relative to the first PCB.

8. A micro-electromechanical transducer according to claim 2, wherein the micro-electromechanical transducer further comprises a second PCB comprising a plurality of contact zones arranged on an exterior surface thereof, said second PCB being oppositely arranged relative to the first PCB, and that the second PCB comprises an indentation in an interior surface.

9. A micro-electromechanical transducer according to claim 1, wherein the microphone cartridge is secured to the volume separating element using a sealing.

10. A micro-electromechanical transducer according to claim 9, wherein the microphone cartridge and the signal processing unit are flip-chip mounted to an interior surface of a bottom PCB, said bottom PCB comprising a plurality of contact zones arranged on an exterior surface thereof.

11. A micro-electromechanical transducer according to claim 10, wherein a venting channel is provided between the microphone cartridge and the interior surface of the bottom PCB.

12. A micro-electromechanical transducer according to claim 10, wherein a venting channel is provided between the signal processing unit and the interior surface of the bottom PCB.

13. A hearing device comprising a micro-electromechanical transducer according to claim 1, said hearing device being selected from the group consisting of: hearing aids, earbuds, personal audio devices, earphones and hearables.

* * * * *